United States Patent
Li et al.

(10) Patent No.: US 10,403,309 B2
(45) Date of Patent: Sep. 3, 2019

(54) DUAL SPIN-ORBIT TORQUE OSCILLATOR IN MAGNETIC RECORDING

(71) Applicant: Western Digital Technologies, Inc., San Jose, CA (US)

(72) Inventors: Zhanjie Li, Pleasanton, CA (US); Suping Song, Fremont, CA (US); Michael Kuok San Ho, Emerald Hills, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/243,851

(22) Filed: Jan. 9, 2019

(65) Prior Publication Data

US 2019/0147907 A1    May 16, 2019

Related U.S. Application Data

(62) Division of application No. 15/631,887, filed on Jun. 23, 2017, now Pat. No. 10,210,888.

(51) Int. Cl.
*G11B 5/31* (2006.01)
*G11B 5/127* (2006.01)
(Continued)

(52) U.S. Cl.
CPC ........ *G11B 5/1278* (2013.01); *G01R 33/1284* (2013.01); *G11B 5/314* (2013.01);
(Continued)

(58) Field of Classification Search
None
See application file for complete search history.

(56) References Cited

U.S. PATENT DOCUMENTS

| 8,107,352 B1* | 1/2012 | Yamanaka | G11B 5/1278 360/125.02 |
| 8,238,059 B1 | 8/2012 | Tang et al. | |

(Continued)

FOREIGN PATENT DOCUMENTS

WO    WO-2018111356 A1 *  6/2018 ........... G11B 5/3116

OTHER PUBLICATIONS

Song, et al.; Micromagnetic Analysis of Adjacent Track Erasure of Wrapped-Around Shielded PMR Writers; IEEE Transactions on Magnetics; vol. 45, No. 10; dated Nov. 10, 2009; 10 total pages.

(Continued)

*Primary Examiner* — William J Klimowicz
(74) *Attorney, Agent, or Firm* — Patterson & Sheridan, LLP; Steven Versteeg

(57) ABSTRACT

The present disclosure generally relates to data storage devices, and more specifically, to a magnetic media drive employing a magnetic recording head. The head includes a main pole, a trailing shield, and an oscillator located between the main pole and the trailing shield. The oscillator is disposed at a media facing surface (MFS). The oscillator includes a spin-torque layer sandwiched between two distinct spin Hall layers. The two distinct spin Hall layers generate spin-orbit torque (SOT) that induces in-plane precessions on opposite surfaces of the spin-torque layer, and both in-plane precessions are in the same direction. The same-direction in-plane precessions on opposite surfaces of the spin-torque layer reduce the critical current of the oscillation of the oscillator, leading to high quality recording.

14 Claims, 11 Drawing Sheets

(51) Int. Cl.
    *H01L 27/22*     (2006.01)
    *H01L 43/08*     (2006.01)
    *G01R 33/12*     (2006.01)
    *G11C 11/18*     (2006.01)
    *H01L 43/04*     (2006.01)
    *G11B 5/00*     (2006.01)

(52) U.S. Cl.
    CPC ............ *G11B 5/315* (2013.01); *G11B 5/3116* (2013.01); *G11B 5/3133* (2013.01); *G11C 11/18* (2013.01); *H01L 27/222* (2013.01); *H01L 43/04* (2013.01); *H01L 43/08* (2013.01); *G11B 2005/0008* (2013.01); *G11B 2005/0024* (2013.01)

(56) References Cited

U.S. PATENT DOCUMENTS

| | | | |
|---|---|---|---|
| 8,264,916 B1 * | 9/2012 | Aoyama | G11B 5/1278 360/125.08 |
| 8,295,006 B2 | 10/2012 | Sugano et al. | |
| 8,611,046 B2 | 12/2013 | Wu et al. | |
| 8,964,332 B1 * | 2/2015 | Katada | G11B 5/56 360/125.3 |
| 9,007,722 B2 * | 4/2015 | Shimizu | G11B 5/35 360/119.04 |
| 9,196,271 B1 | 11/2015 | Shirotori et al. | |
| 9,230,571 B1 | 1/2016 | Chen et al. | |
| 9,305,583 B1 | 4/2016 | Zhang et al. | |
| 9,311,934 B1 | 4/2016 | Shiimoto et al. | |
| 9,355,654 B1 | 5/2016 | Mallary | |
| 9,361,912 B1 | 6/2016 | Liu et al. | |
| 9,466,319 B1 | 10/2016 | Tang et al. | |
| 10,014,012 B1 * | 7/2018 | Song | G11B 5/1278 |
| 10,210,888 B1 * | 2/2019 | Li | G11B 5/3133 |
| 2008/0232001 A1 | 9/2008 | Bonhote et al. | |
| 2008/0278861 A1 | 11/2008 | Jiang et al. | |
| 2011/0090584 A1 * | 4/2011 | Franca-Neto | G11B 5/02 360/55 |
| 2011/0090596 A1 * | 4/2011 | Franca-Neto | G11B 5/1278 360/125.03 |
| 2012/0301746 A1 * | 11/2012 | Franca-Neto | G11B 5/1278 428/810 |
| 2015/0287426 A1 | 10/2015 | Mihajlovic et al. | |

OTHER PUBLICATIONS

Mihajlovic, et al.; Spin Orbit Torque Switching of CoFeB Magnetic Free Layers With Pt and Ta Heavy Metals for SOT MRAM Development; IEEE Magnetics; TMRC 2016; Aug. 17-19, 2016; pp. 53 and 54.

* cited by examiner

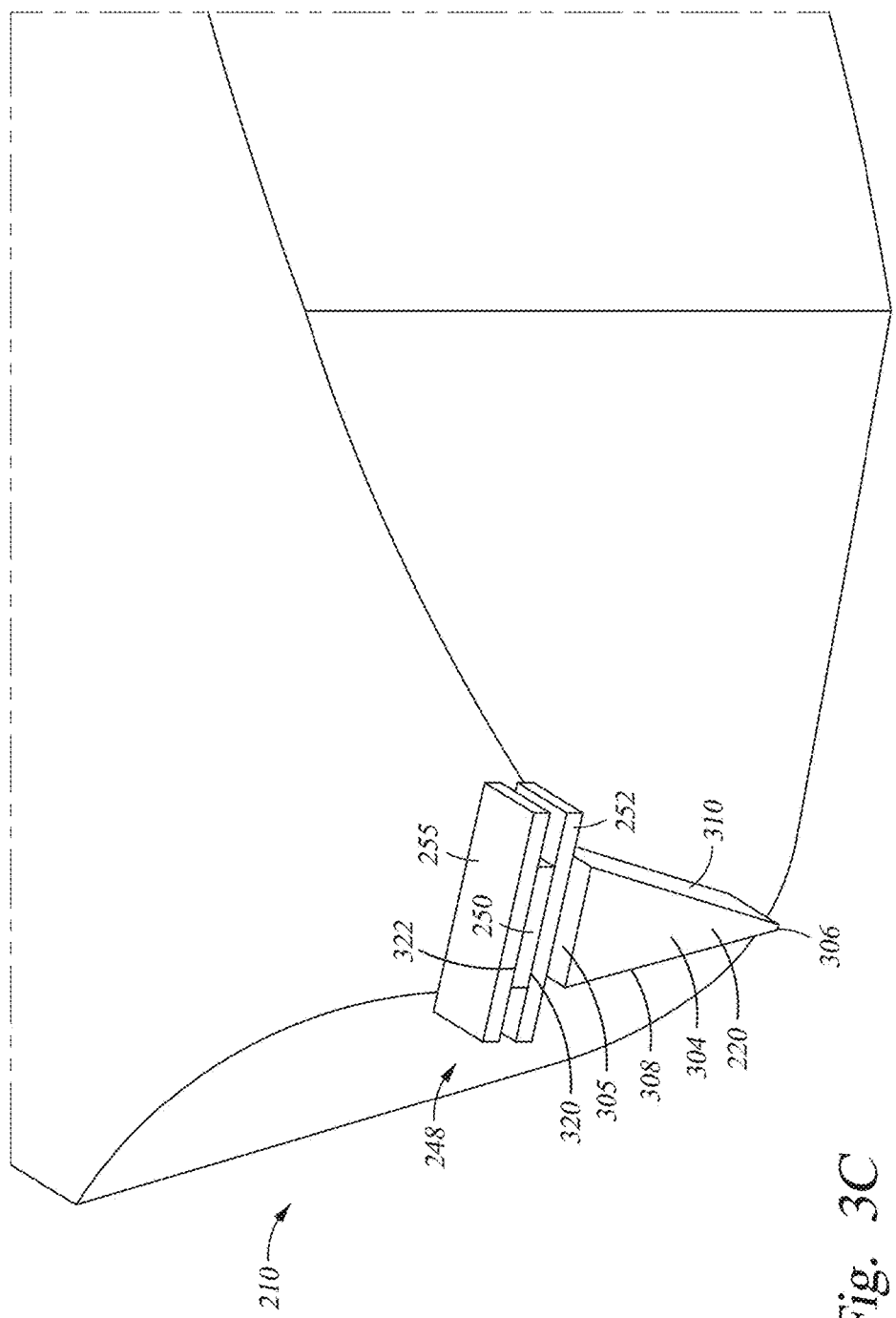

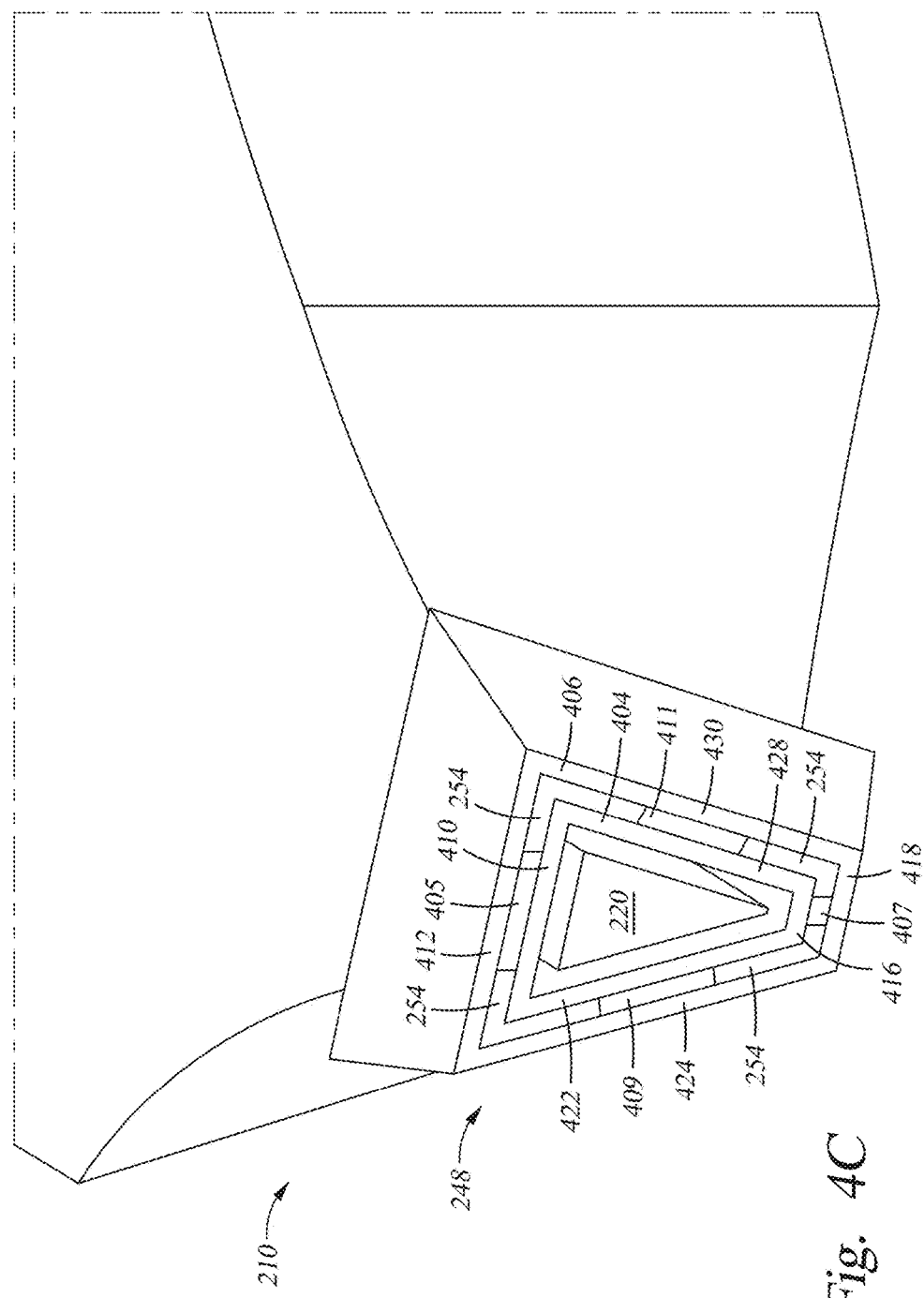

US 10,403,309 B2

DUAL SPIN-ORBIT TORQUE OSCILLATOR IN MAGNETIC RECORDING

CROSS-REFERENCE TO RELATED APPLICATIONS

This application is a divisional of co-pending U.S. patent application Ser. No. 15/631,887, filed Jun. 23, 2017, which is herein incorporated by reference.

BACKGROUND

Field of the Disclosure

Embodiments of the present disclosure generally relate to data storage devices, and more specifically, to a magnetic media drive employing a magnetic recording head.

Description of the Related Art

Over the past few years, various magnetic recording methods have been studied to improve the areal density of a magnetic media device, such as a hard disk drive (HDD). For example, microwave assisted magnetic recording (MAMR) enabled magnetic recording utilizes spin-transfer torque (STT), which is generated from a pseudo spin-valve structure. During operation, electrical current flows from the main pole to the trailing shield hot seed layer, and the spin-torque layer magnetization switching (or precession) is induced by the STT.

The pseudo spin-valve structure is difficult to make, and high switching current and voltage ($V_{jump}$) are utilized during its operation, leading to a lower level of energy efficiency.

Therefore, there is a need in the art for an improved data storage device.

SUMMARY OF THE DISCLOSURE

The present disclosure generally relates to data storage devices, and more specifically, to a magnetic media drive employing a magnetic recording head. The head includes a main pole, a trailing shield, and an oscillator located between the main pole and the trailing shield. The oscillator is disposed at a media facing surface (MFS). The oscillator includes a spin-torque layer sandwiched between two distinct spin Hall layers. The two distinct spin Hall layers generate spin-orbit torque (SOT) that induces in-plane precessions on opposite surfaces of the spin-torque layer, and both in-plane precessions are in the same direction. The same-direction in-plane precessions on opposite surfaces of the spin-torque layer reduce the critical current of the oscillation of the oscillator, leading to high quality recording.

In one embodiment, a magnetic recording head includes a main pole and an oscillator disposed adjacent the main pole. The oscillator includes a first spin Hall layer, a second spin Hall layer distinct from the first spin Hall layer, and a spin-torque layer disposed between the first spin Hall layer and the second spin Hall layer.

In another embodiment, a magnetic recording head includes a main pole and an oscillator surrounding at least two surfaces of the main pole. The oscillator includes a first spin Hall structure disposed adjacent the main pole, a second spin Hall structure surrounding the first spin Hall structure, and two or more spin-torque layers disposed between the first spin Hall structure and the second spin Hall structure.

In another embodiment, a data storage device includes a magnetic read head and a magnetic write head. The magnetic write head includes a trailing shield hot seed layer, a leading shield, a first side shield, a second side shield, a main pole, and an oscillator disposed between the trailing shield hot seed layer and the main pole, between the leading shield and the main pole, between the first side shield and the main pole, and between the second side shield and the main pole.

In another embodiment, a magnetic recording head includes a main pole, means for generating spin-orbit torque, and means for same-direction in-plane precessions that are induced by the spin-orbit torque.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3C is a perspective view of the portion of the write head of FIG. 3A according to one embodiment.

FIG. 4C is a perspective view of the portion of the write head of FIG. 4A according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to data storage devices, and more specifically, to a magnetic media drive employing a magnetic recording head. The head includes a main pole, a trailing shield, and an oscillator located between the main pole and the trailing shield. The oscillator is disposed at a media facing surface (MFS). The oscillator includes a spin-torque layer sandwiched between two distinct spin Hall layers. The two distinct spin Hall layers generate spin-orbit torque (SOT) that induces in-plane precessions on opposite surfaces of the spin-torque layer, and both in-plane precessions are in the same direction. The same-direction in-plane precessions on opposite surfaces of the spin-torque layer reduce the critical current of the oscillation of the oscillator, leading to high quality recording.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between layers may be directly in contact with the two layers or may have one or more intervening layers. In contrast, a first layer "on" a second layer is in contact with the second layer. Additionally, the relative position of one layer with respect to other layers is provided assuming operations are performed relative to a substrate without consideration of the absolute orientation of the substrate.

Figure 1:
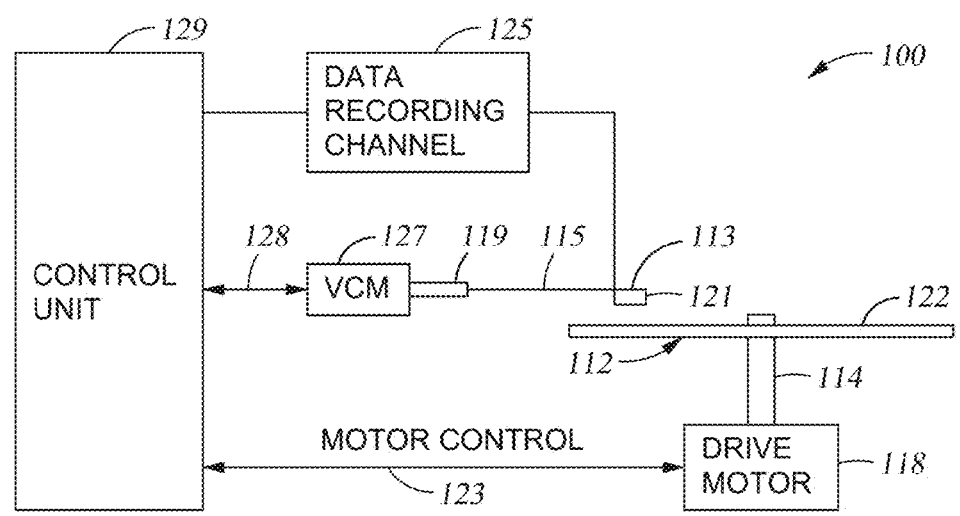
FIG. 1 is a schematic illustration of a magnetic media device according to one embodiment.

FIG. 1 is a schematic illustration of a data storage device such as a magnetic media device. Such a data storage device may be a single drive/device or comprise multiple drives/devices. For the sake of illustration, a single disk drive 100 is shown according to one embodiment. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121 that may include two distinct spin Hall layers for generating SOT. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media device and the accompanying illustration of FIG. 1 are for representation purposes only. It should be apparent that magnetic media devices may contain a large number of media, or disks, and actuators, and each actuator may support a number of sliders.

Figure 2:
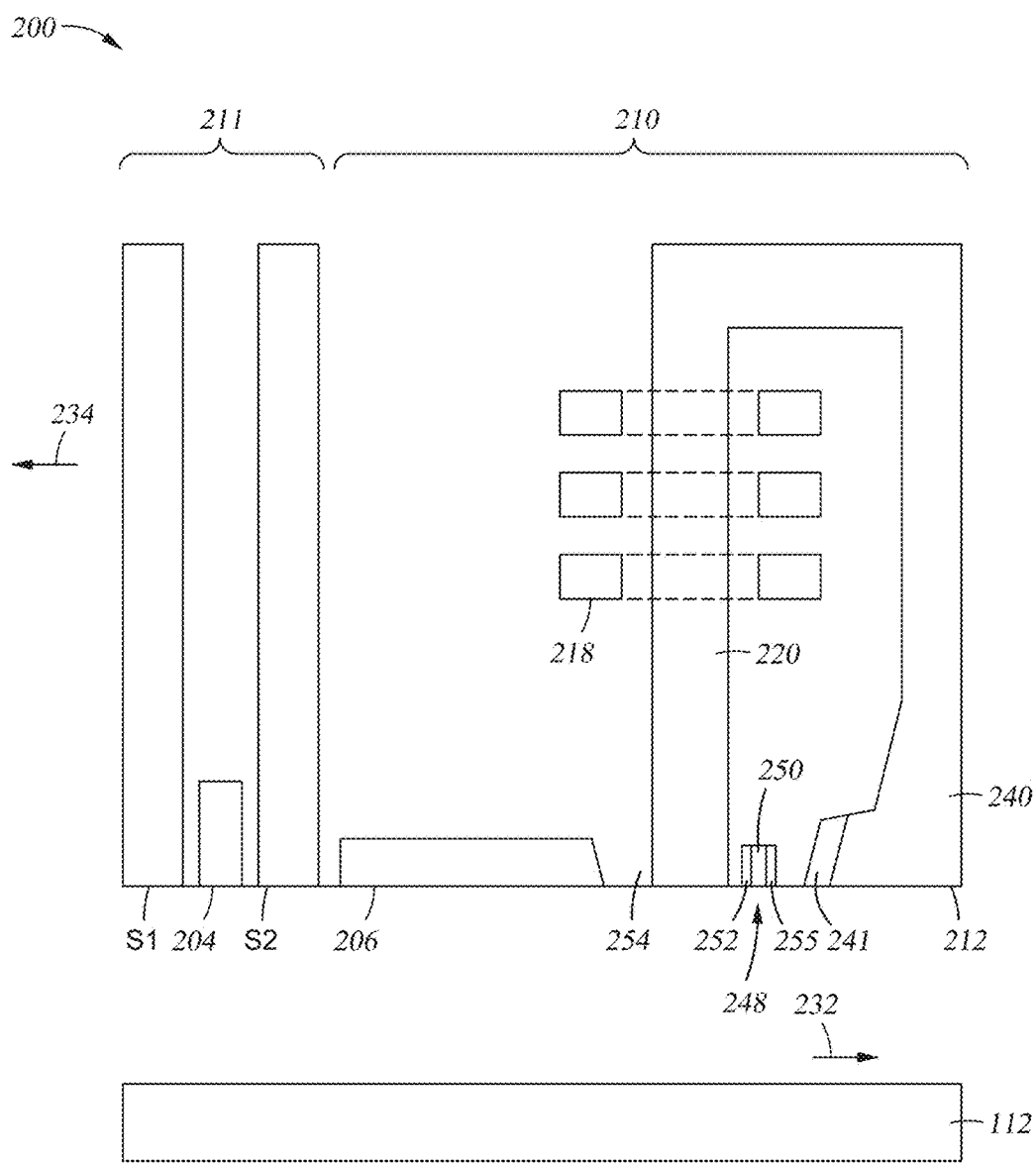
FIG. 2 is a fragmented, cross sectional side view of a read/write head facing a magnetic disk according to one embodiment.

FIG. 2 is a fragmented, cross sectional side view of a read/write head 200 facing the magnetic disk 112 according to one embodiment. The read/write head 200 may correspond to the magnetic head assembly 121 described in FIG. 1. The read/write head 200 includes a MFS 212, such as an air bearing surface (ABS), facing the disk 112, a magnetic write head 210, and a magnetic read head 211. As shown in FIG. 2, the magnetic disk 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits.

The write head 210 includes a main pole 220, a leading shield 206, a trailing shield 240, an oscillator 248, and a coil 218 that excites the main pole 220. The coil 218 may have a "pancake" structure which winds around a back-contact between the main pole 220 and the trailing shield 240, instead of a "helical" structure shown in FIG. 2. The oscillator 248 is disposed between the main pole 220 and the trailing shield 240. The oscillator 248 is disposed at the MFS 212 between the trailing shield 240 and the main pole 220. The oscillator 248 may surround two or more surfaces of the main pole 220. The oscillator 248 includes a spin-torque layer 250, a first spin Hall layer 252, and a second spin Hall layer 255. The spin-torque layer 250 is sandwiched between the first spin Hall layer 252 and the second spin Hall layer 255. A trailing shield hot seed layer 241 is coupled to the trailing shield 240, and the trailing shield hot seed layer 241 faces the oscillator 248. The definition of the term "face" is extended to include a material located between a first element that is facing a second element and the second element. For example, the trailing shield hot seed layer 241 faces the oscillator 248, and a dielectric material 254, such as alumina is located between the trailing shield hot seed layer 241 and the spin Hall layer 252. The dielectric material 254 is also disposed between the main pole 220 and the oscillator 248 and between the leading shield 206 and the main pole 220. The main pole 220 may be a magnetic material such as a FeCo alloy. The leading shield 206 and the trailing shield 240 may be a magnetic material, such as NiFe alloy. The trailing shield hot seed layer 241 may include a high moment sputter material, such as CoFeN or FeXN, where X includes at least one of Rh, Al, Ta, Zr, and Ti.

The spin-torque layer 250 may be a magnetic material, such as a soft magnetic material, for example CoFe alloy, NiFe alloy, CoFeB alloy or half-metals. The first spin Hall layer 252 and the second spin Hall layer 255 each may be a heavy metal, such as beta phase Tantalum (β-Ta), beta phase tungsten (β-W), platinum (Pt), hafnium (Hf), a heavy metal alloy of tungsten with hafnium, iridium, or bismuth doped copper, a topological insulator such as a (Bi,Sb)Te, or antiferromagnetic materials such as MnIr, XMn (X=Fe, Pd, Ir, and Pt) and Cu—Au—I type antiferromagnets. The first spin Hall layer 252 is distinct from the second spin Hall layer 255. In one embodiment, the first spin Hall layer 252 is Pt, and the second spin Hall layer 255 is β-Ta or β-W. In another embodiment, the first spin Hall layer 252 is β-Ta or β-W and the second spin Hall layer 255 is Pt.

During operation, an electrical current flows through the first spin Hall layer 252 and the second spin Hall layer 255, which have strong spin-orbit coupling, and SOT is generated by the first spin Hall layer 252 and the second spin Hall layer 255. The SOT generated by the first spin Hall layer 252 and the second spin Hall layer 255 induces magnetization precession of the spin-torque layer 250. In some embodiments, the SOT based head has an effective spin injection efficiency ($\beta$) of about 0.3 to 0.6, about 2 to 6 times larger than that of a head using a pseudo spin-valve structure (having an effective spin injection efficiency ($\beta$) of about 0.1 to 0.3). Higher effective spin injection efficiency leads to reduced critical switching current density, which is defined by the formula:

$$J_{C0} \approx \frac{2e}{\hbar} \mu_0 M_S t \alpha (H_C + M_{eff}/2)/\beta$$

Based on this formula, the 2 to 6 times increase in effective spin injection efficiency ($\beta$) for the SOT based head leads to a reduction of the critical switching current density by 2 to 6 times, which in turn brings a higher energy efficiency (about 2 to 6 times less energy used than that of a head using a pseudo spin-valve structure). Furthermore, the first spin Hall layer 252 and the second spin Hall layer 255 induces in-plane precessions on opposite surfaces of the spin-torque layer 250, and the in-plane precessions on the two surfaces of the spin-torque layer 250 are in the same direction because the first spin Hall layer 252 and the second spin Hall layer 255 have different spin Hall angles. For example, the first spin Hall layer 252 may have a positive spin Hall angle, and the second spin Hall layer 255 may have a negative spin Hall angle. The same-direction in-plane precessions on opposite surfaces of the spin-torque layer 250 reduce the critical current of the oscillation of the oscillator 248. The stable oscillation of the oscillator 248 provides an AC magnetic field to the recording medium, such as the magnetic disk 112, in which a radio frequency (RF) field generated by the SOT induces magnetization switching, thus high quality recording is achieved.

Figure 3A:
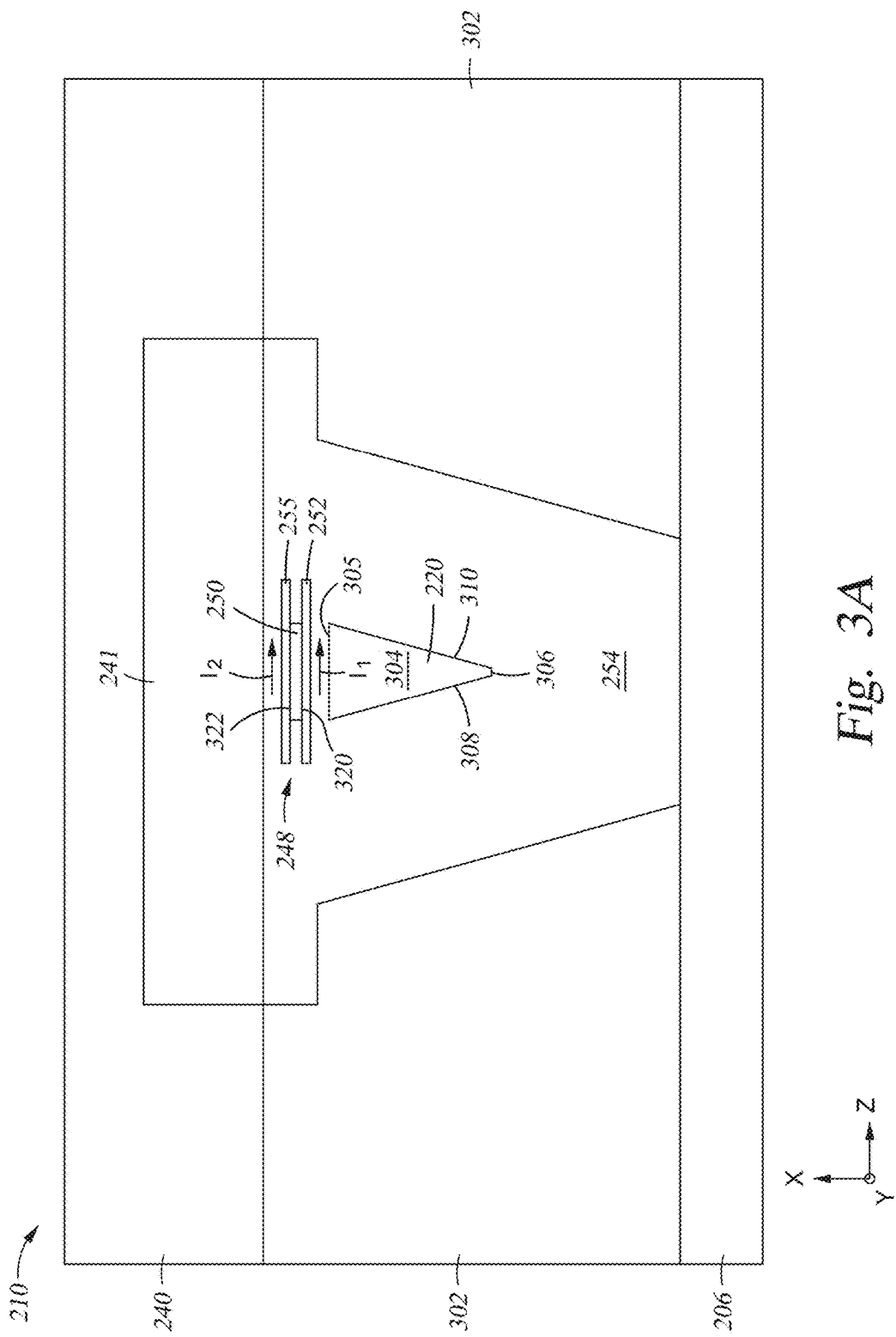
FIGS. 3A-3B are MFS views of a portion of a write head of FIG. 2 according to embodiments.

FIG. 3A is a MFS view of a portion of the write head 210 of FIG. 2 according to one embodiment. As shown in FIG. 3A, the write head 210 includes the trailing shield 240, the trailing shield hot seed layer 241, the main pole 220, and the leading shield 206. The write head 210 further includes side shields 302 sandwiching the main pole 220 along the cross-track direction, as indicated by the Z-axis. The side shields 302 are in direct contact with the leading shield 206 and the trailing shield 240. The side shields 302 are separated from the trailing shield hot seed layer 241 by the dielectric material 254. The side shields 302 may be fabricated from a magnetic material, such as NiFe alloy.

The main pole 220 includes a first surface 304 at the MFS 212, a second surface 305 adjacent the first surface 304, a third surface 306 opposite the second surface 305, a fourth surface 308 connecting the third surface 306 and the second surface 305, and a fifth surface 310 opposite the fourth surface 308. The oscillator 248 is disposed between the second surface 305 of the main pole 220 and the trailing shield hot seed layer 241. As shown in FIG. 3A, the spin-torque layer 250 includes a first surface 320 and a second surface 322 opposite the first surface 320. The first surface 320 of the spin-torque layer 250 is in direct contact with the first spin Hall layer 252, and the second surface 322 of the spin-torque layer 250 is in direct contact with the second spin Hall layer 255. During operation, an electrical current ($I_1$) flows through the first spin Hall layer 252, causing the first spin Hall layer 252 to generate SOT. The SOT generated by the first spin Hall layer 252 induces in-plane precession on the first surface 320 of the spin-torque layer 250, and the in-plane precession on the first surface 320 is in a first direction. An electrical current ($I_2$) flows through the second spin Hall layer 255, causing the second spin Hall layer 255 to generate SOT. The SOT generated by the second spin Hall layer 255 induces in-plane precession on the second surface 322 of the spin-torque layer 250, and the in-plane precession on the second surface 322 is in a direction that is the same as the first direction. The same-direction in-plane precessions on opposite surfaces 320, 322 of the spin-torque layer 250 reduce the critical current of the oscillation of the oscillator 248. The electrical currents ($I_1$) and ($I_2$) may be from a single electrical current flowed from the preamp (not shown).

Figure 3B:
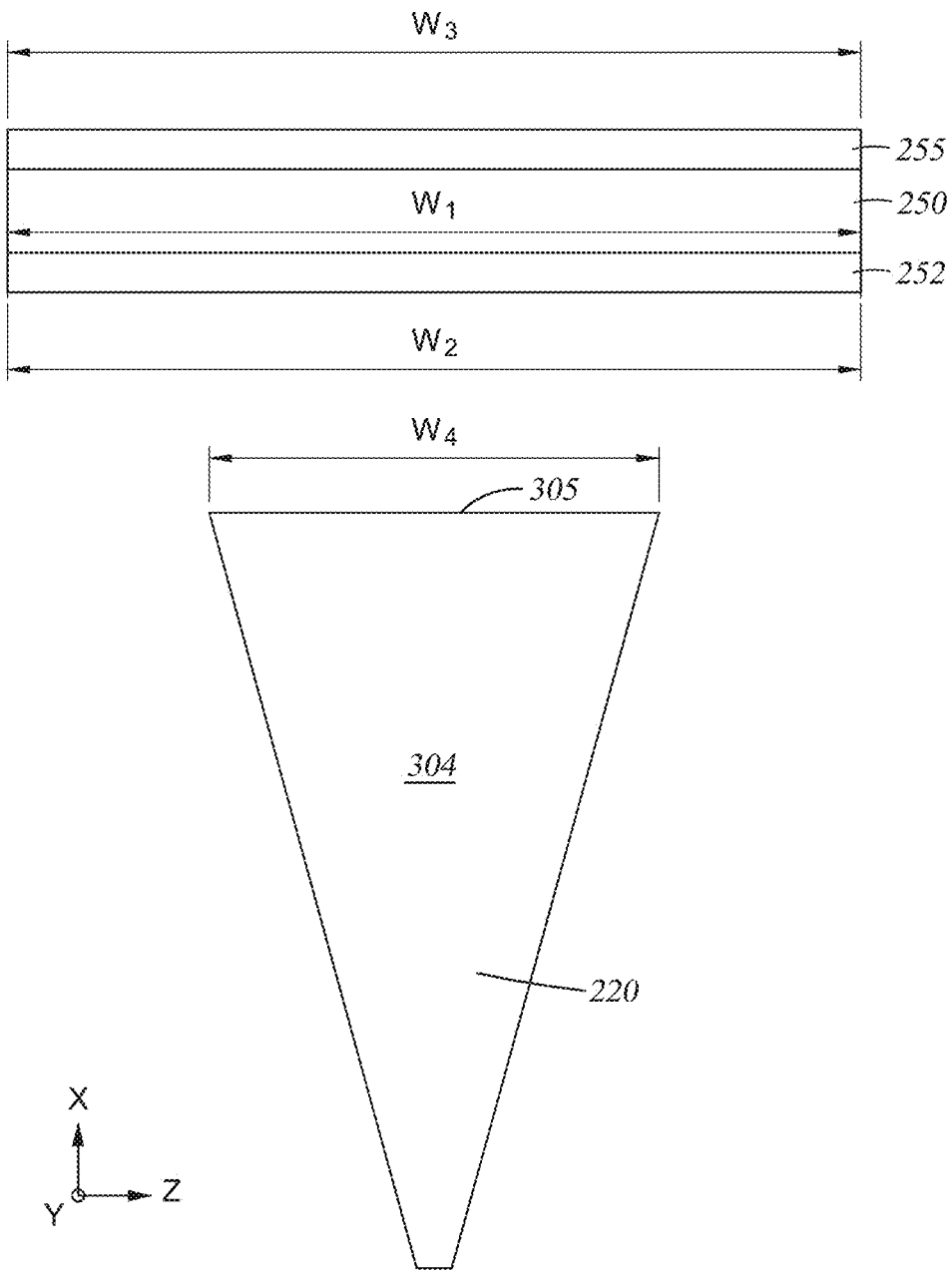

FIG. 3B is a MFS view of a portion of the write head 210 of FIG. 2 according to another embodiment. As shown in FIG. 3B, the spin-torque layer 250 has a width $W_1$, the first spin Hall layer 252 has a width $W_2$, the second spin Hall layer 255 has a width $W_3$, and the second surface 305 of the main pole 220 has a width $W_4$ at the MFS 212. The widths $W_1$, $W_2$, $W_3$, and $W_4$ are in the cross-track direction, as indicated by the Z-axis. The width $W_1$ of the spin-torque layer 250 may be substantially the same as the width $W_4$ of the second surface 305 of the main pole 220 (as shown in FIG. 3A), or substantially greater than the width $W_4$ of the second surface 305 of the main pole 220 (as shown in FIG. 3B). The width $W_2$ of the first spin Hall layer 252 may be substantially the same as the width $W_3$ of the second spin Hall layer 255. The width $W_1$ of the spin-torque layer 250 may be substantially less than the width $W_2$ of the first spin Hall layer 252 or the width $W_3$ of the second spin Hall layer 255 (as shown in FIG. 3A), or substantially the same as the width $W_2$ of the first spin Hall layer 252 or the width $W_3$ of the second spin Hall layer 255 (as shown in FIG. 3B). The width $W_2$ of the first spin Hall layer 252 may be substantially different from the width $W_3$ of the second spin Hall layer 255.

FIG. 3C is a perspective view of the portion of the write head 210 of FIG. 3A according to one embodiment. For clarity purposes, the insulating material is not shown in FIG. 3C. The trailing shield 240, the trailing shield hot seed layer 241, the side shields 302, and the leading shield 206 are omitted for clarity. As shown in FIG. 3C, the write head 210 includes the oscillator 248 disposed adjacent the second surface 305 of the main pole 220. The oscillator 248 includes the spin-torque layer 250 sandwiched between the first spin Hall layer 252 and the second spin Hall layer 255. The width of the spin-torque layer 250 may be substantially less than the width of the first spin Hall layer 252 or the width of the second spin Hall layer 255, as shown in FIG. 3C, or substantially the same as the width of the first spin Hall layer 252 or the width of the second spin Hall layer 255 (as shown in FIG. 3B).

Figure 4A:
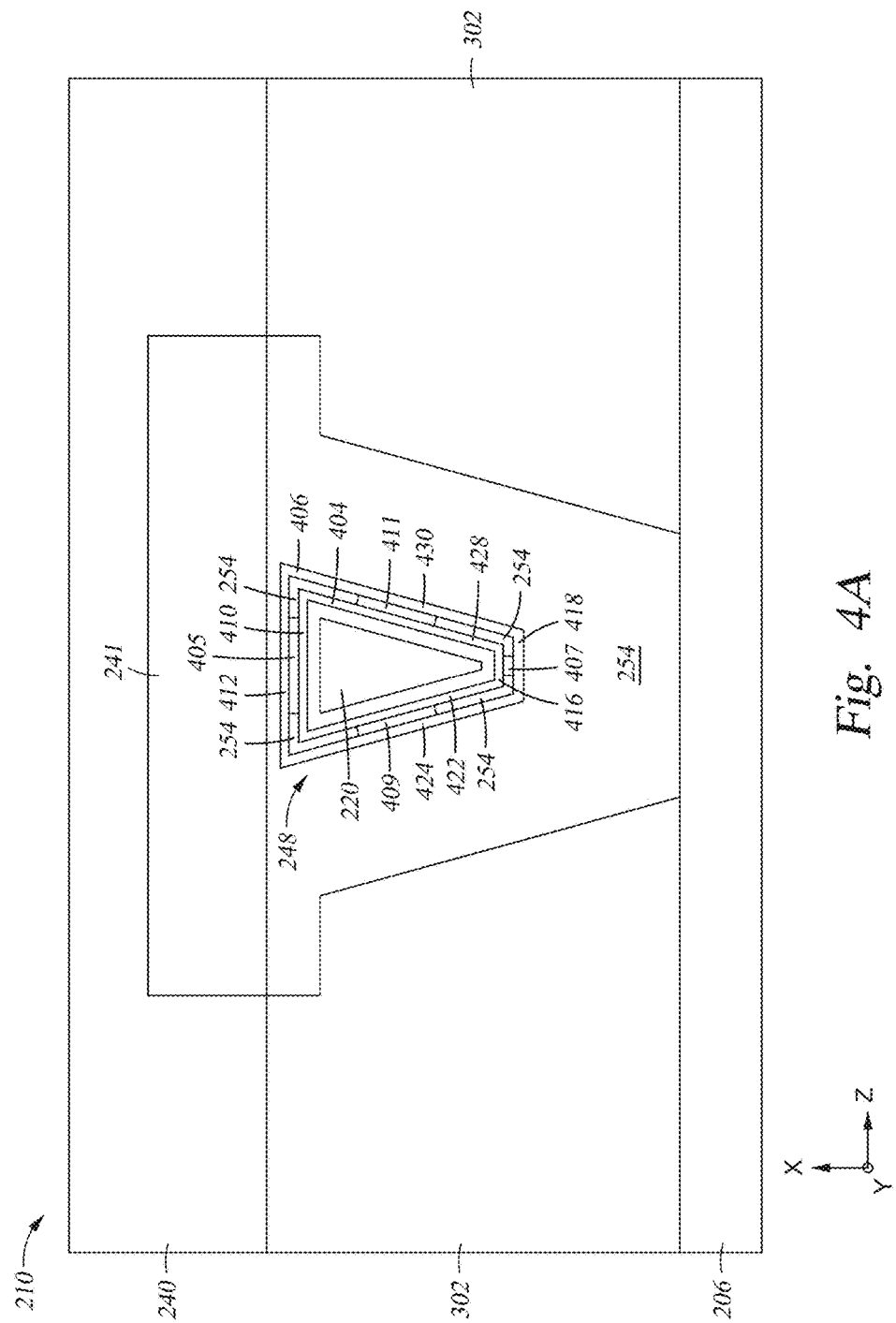
FIGS. 4A-4B are MFS views of the portion of a write head of FIG. 2 according to embodiments.

FIG. 4A is a MFS view of the portion of a write head 210 of FIG. 2 according to one embodiment. In some embodiments, the oscillator 248 surrounds more than one surface of the main pole 220 at the MFS 212. As shown in FIG. 4A, the oscillator 248 wraps around the main pole 220 at the MFS 212. The definition of the term "wrap around" is extended to include having a material located between the element that is wrapping around and the element that is being wrapped around. In other words, a material may be located between a first element and a second element, and the first element wraps around the second element. For example, the dielectric material 254 may be located between the oscillator 248 and the main pole 220, and the oscillator 248 wraps around the main pole 220. The oscillator 248 is disposed between the trailing shield hot seed layer 241 and the main pole 220, between the side shields 302 and the main pole 220, and between the leading shield 206 and the main pole 220.

The oscillator 248 includes a first spin Hall structure 404, a second spin Hall structure 406, and a plurality of spin-torque layers 405, 407, 409, 411 disposed between the first spin Hall structure 404 and the second spin Hall structure 406. The first spin Hall structure 404 and the second spin Hall structure 406 may be fabricated from the same materials as the first spin Hall layer 252 and the second spin Hall layer 255, respectively. The plurality of spin-torque layers 405, 407, 409, 411 may be fabricated from the same material as the spin-torque layer 250. In one embodiment, the first spin Hall structure 404 is fabricated from β-Ta or β-W, and the second spin Hall structure 406 is fabricated from Pt. The first spin Hall structure 404 includes a first portion 410, a second portion 416 opposite the first portion 410, a third portion 422 connecting the first portion 410 and the second portion 416, and a fourth portion 428 opposite the third portion 422. The second spin Hall structure 406 wraps around the first spin Hall structure 404. The second spin Hall structure 406 includes a first portion 412 adjacent to the trailing shield hot seed layer 241, a second portion 418 opposite the first portion 412, a third portion 424 connecting the first portion 412 and the second portion 418, and a fourth portion 430 opposite the third portion 424. The second portion 418 faces the leading shield 206. The first portion 412 of the second spin Hall structure 406 may be substantially parallel to the first portion 410 of the first spin Hall structure 404, the second portion 418 of the second spin Hall structure 406 may be substantially parallel to the second portion 416 of the first spin Hall structure 404, the third portion 424 of the second spin Hall structure 406 may be substantially parallel to the third portion 422 of the first spin Hall structure 404, and the fourth portion 430 of the second spin Hall structure 406 may be substantially parallel to the fourth portion 428 of the first spin Hall structure 404.

The spin-torque layer 405 is disposed between the first portion 410 of the first spin Hall structure 404 and the first portion 412 of the second spin Hall structure 406. The spin-torque layer 405 is in direct contact with the first portion 410 of the first spin Hall structure 404 and the first portion 412 of the second spin Hall structure 406, and the opposite surfaces of the spin-torque layer 405 that are in contact with the first spin Hall structure 404 and the second spin Hall structure 406 have same-direction in-plane precessions that are induced by the SOT generated by the first spin Hall structure 404 and the second spin Hall structure 406 as electrical currents flow through the first spin Hall structure 404 and the second spin Hall structure 406. The spin-torque layer 405 may have the same dimensions as the spin-torque layer 250, as shown in FIG. 3A. The spin-torque layer 405 is sandwiched between the dielectric material 254 disposed between the first portion 410 of the first spin Hall structure 404 and the first portion 412 of the second spin Hall structure 406.

The spin-torque layer 407 is disposed between the second portion 416 of the first spin Hall structure 404 and the second portion 418 of the second spin Hall structure 406. The spin-torque layer 407 is in direct contact with the second portion 416 of the first spin Hall structure 404 and the second portion 418 of the second spin Hall structure 406, and the opposite surfaces of the spin-torque layer 407 that are in contact with the first spin Hall structure 404 and the second spin Hall structure 406 have same-direction in-plane precessions that are induced by the SOT generated by the first spin Hall structure 404 and the second spin Hall structure 406 as electrical currents flow through the first spin Hall structure 404 and the second spin Hall structure 406. The spin-torque layer 407 is sandwiched between the dielectric material 254 disposed between the second portion 416 of the first spin Hall structure 404 and the second portion 418 of the second spin Hall structure 406.

The spin-torque layer 409 is disposed between the third portion 422 of the first spin Hall structure 404 and the third portion 424 of the second spin Hall structure 406. The spin-torque layer 409 is in direct contact with the third portion 422 of the first spin Hall structure 404 and the third portion 424 of the second spin Hall structure 406, and the opposite surfaces of the spin-torque layer 409 that are in contact with the first spin Hall structure 404 and the second spin Hall structure 406 have same-direction in-plane precessions that are induced by the SOT generated by the first spin Hall structure 404 and the second spin Hall structure 406 as electrical currents flow through the first spin Hall structure 404 and the second spin Hall structure 406. The spin-torque layer 409 is sandwiched between the dielectric material 254 disposed between the third portion 422 of the first spin Hall structure 404 and the third portion 424 of the second spin Hall structure 406.

The spin-torque layer 411 is disposed between the fourth portion 428 of the first spin Hall structure 404 and the fourth portion 430 of the second spin Hall structure 406. The spin-torque layer 411 is in direct contact with the fourth portion 428 of the first spin Hall structure 404 and the fourth portion 430 of the second spin Hall structure 406, and the opposite surfaces of the spin-torque layer 411 that are in contact with the first spin Hall structure 404 and the second spin Hall structure 406 have same-direction in-plane precessions that are induced by the SOT generated by the first spin Hall structure 404 and the second spin Hall structure 406 as electrical currents flow through the first spin Hall structure 404 and the second spin Hall structure 406. The spin-torque layer 411 is sandwiched between the dielectric material 254 disposed between the fourth portion 428 of the first spin Hall structure 404 and the fourth portion 430 of the second spin Hall structure 406.

In some embodiments, the oscillator 248 surrounds three surfaces 305, 308, 310 of the main pole 220 at the MFS 212, and the second portion 416 of the first spin Hall structure 404, the second portion 418 of the second spin Hall structure 406, and the spin-torque layer 407 are not present. In some embodiments, the plurality of spin-torque layers 405, 407, 409, 411 forms a continuous structure that is disposed between the first spin Hall structure 404 and the second spin Hall structure 406.

Figure 4B:
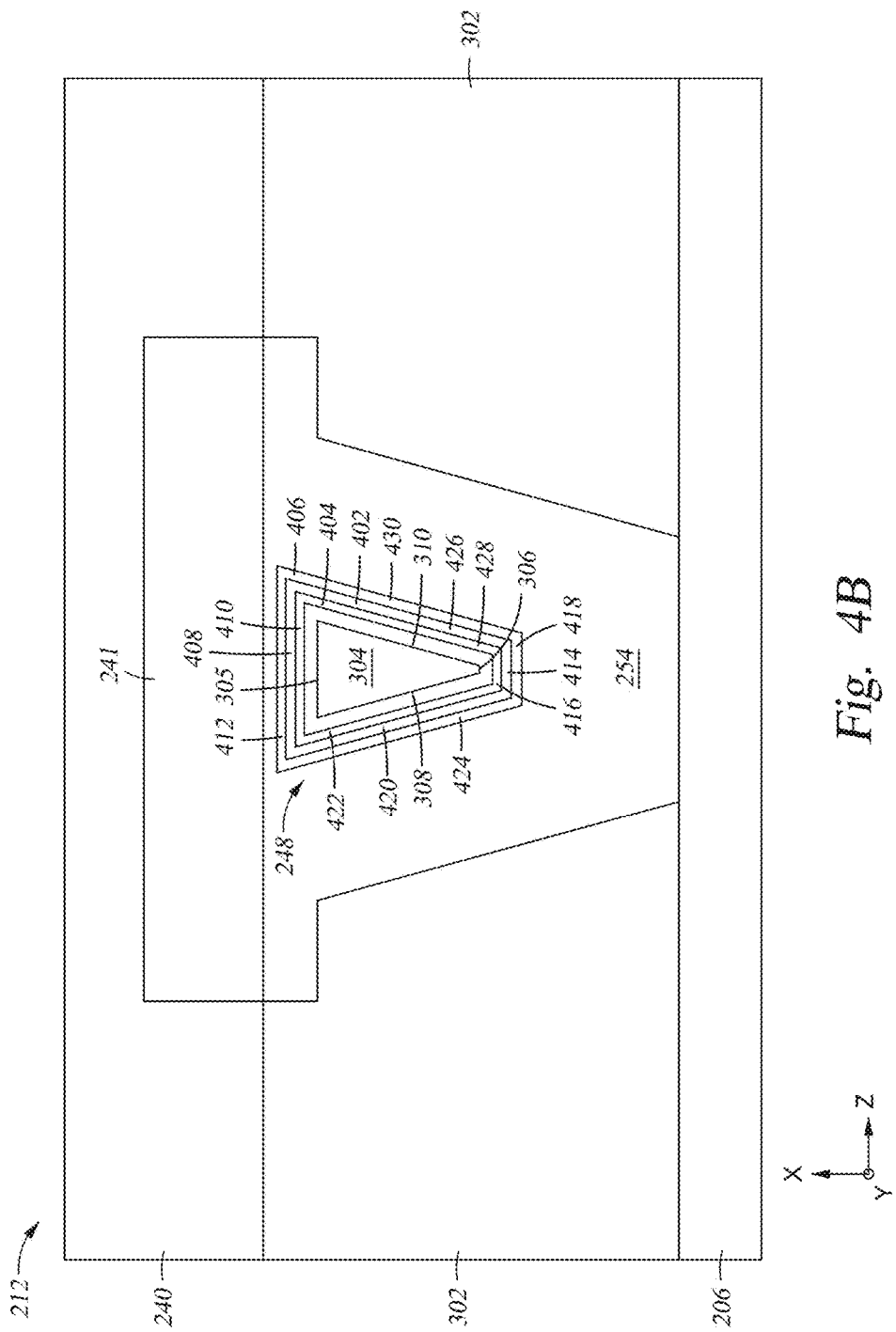

FIG. 4B is a MFS view of the portion of a write head 210 of FIG. 2 according to another embodiment. As shown in FIG. 4B, the oscillator 248 includes the first spin Hall structure 404, the second spin Hall structure 406, and a spin-torque structure 402 sandwiched between the first spin Hall structure 404 and the second spin Hall structure 406. The spin-torque structure 402 may be fabricated from the same material as the spin-torque layer 250. The spin-torque structure 402 includes a first portion 408, a second portion 414 opposite the first portion 408, a third portion 420 connecting the first portion 408 and the second portion 414, and a fourth portion 426 opposite the third portion 420. The first portion 408 of the spin-torque structure 402 is disposed between the first portion 410 of the first spin Hall structure 404 and the first portion 412 of the second spin Hall structure 406, and the first portion 408 of the spin-torque structure 402 is in direct contact with the first portion 410 of the first spin Hall structure 404 and the first portion 412 of the second spin Hall structure 406. The second portion 414 of the spin-torque structure 402 is disposed between the second portion 416 of the first spin Hall structure 404 and the second portion 418 of the second spin Hall structure 406, and the second portion 414 of the spin-torque structure 402 is in direct contact with the second portion 416 of the first spin Hall structure 404 and the second portion 418 of the second spin Hall structure 406. The third portion 420 of the spin-torque structure 402 is disposed between the third portion 422 of the first spin Hall structure 404 and the third portion 424 of the second spin Hall structure 406, and the third portion 420 of the spin-torque structure 402 is in direct contact with the third portion 422 of the first spin Hall structure 404 and the third portion 424 of the second spin Hall structure 406. The fourth portion 426 of the spin-torque structure 402 is disposed between the fourth portion 428 of the first spin Hall structure 404 and the fourth portion 430 of the second spin Hall structure 406, and the fourth portion 426 of the spin-torque structure 402 is in direct contact with the fourth portion 428 of the first spin Hall structure 404 and the fourth portion 430 of the second spin Hall structure 406.

In some embodiments, the oscillator 248 surrounds three surfaces 305, 308, 310 of the main pole 220 at the MFS 212, and the second portion 416 of the first spin Hall structure 404, the second portion 418 of the second spin Hall structure 406, and the second portion 414 of the spin-torque structure 402 are not present.

During operation, opposite surfaces of the spin-torque structure 402 that are in contact with the first spin Hall structure 404 and the second spin Hall structure 406 have same-direction in-plane precessions that are induced by the SOT generated by the first spin Hall structure 404 and the second spin Hall structure 406 as electrical currents flow through the first spin Hall structure 404 and the second spin Hall structure 406. The same-direction in-plane precessions on opposite surfaces of the spin-torque structure 402 reduce the critical current of the oscillation by the oscillator 248, leading to higher quality recording.

FIG. 4C is a perspective view of the portion of the write head 210 of FIG. 4A according to one embodiment. For clarity purposes, the insulating material is not shown in FIG. 4C. The trailing shield 240, the trailing shield hot seed layer 241, the side shields 302, and the leading shield 206 are omitted for clarity. As shown in FIG. 4C, the oscillator 248 wraps around the main pole 220. The oscillator 248 includes the first spin Hall structure 404 wrapping around the main pole 220, the second spin Hall structure 406 wrapping around the first spin Hall structure 404, and the plurality of spin-torque layers 405, 407, 409, 411 disposed between the first spin Hall structure 404 and the second spin Hall structure 406. The dielectric material 254 is disposed between the first spin Hall structure 404 and the second spin Hall structure 406, and each of the plurality of spin-torque layers 405, 407, 409, 411 is sandwiched between the dielectric material 254. The plurality of spin-torque layers 405, 407, 409, 411 are discrete layers, as shown in FIGS. 4A and 4C. The plurality of spin-torque layers 405, 407, 409, 411 may form a continuous loop, such as the spin-torque structure 402, as shown in FIG. 4B.

Figure 5A:
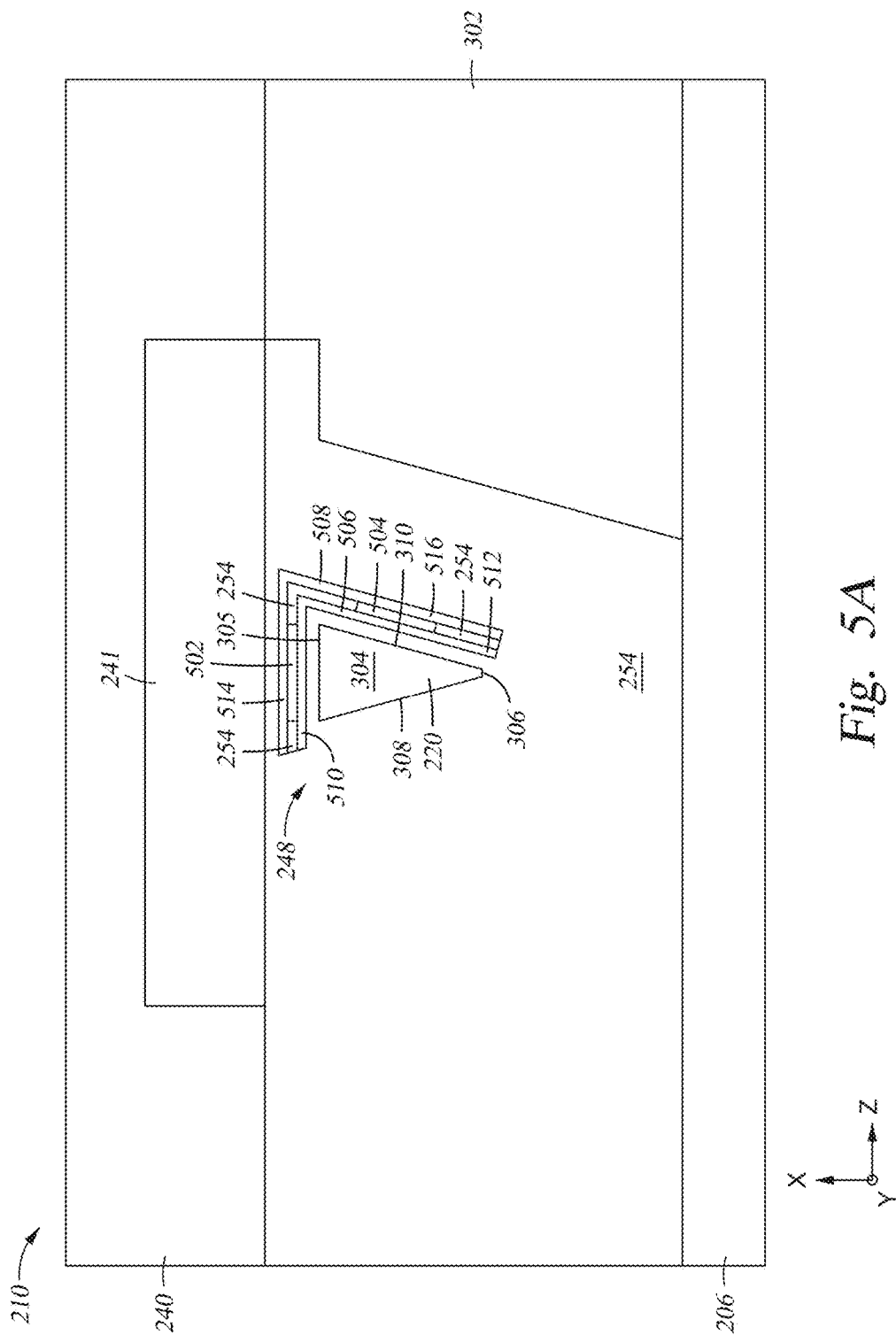
FIGS. 5A-5B are MFS views of the portion of a write head of FIG. 2 according to embodiments.

In some embodiments, such as in a magnetic head utilizing shingled magnetic recording (SMR), the oscillator 248 surrounds the second surface 305 and one of the fourth surface 308 and the fifth surface 310 of the main pole 220. FIG. 5A is a MFS view of the portion of a write head 210 of FIG. 2 according to one embodiment. As shown in Figure 5A, the write head 210 includes the trailing shield 240, the trailing shield hot seed layer 241, the main pole 220, the oscillator 248 surrounding two surfaces of the main pole 220, one side shield 302, and the leading shield 206. SMR does not require two side shields 302, thus one side shield 302 is utilized, and a portion of the oscillator 248 is located between the main pole 220 and the side shield 302. A portion of the oscillator 248 is located between the main pole and the trailing shield hot seed layer 241.

The oscillator 248 includes a first spin Hall structure 506, a second spin Hall structure 508, and two spin-torque layers 502, 504 sandwiched between the first spin Hall structure 506 and the second spin Hall structure 508. The first spin Hall structure 506 and the second spin Hall structure 508 may be fabricated from the same materials as the first spin Hall layer 252 and the second spin Hall layer 255, respectively. The spin-torque layers 502, 504 may be fabricated from the same material as the spin-torque layer 250. In one embodiment, the first spin Hall structure 506 is fabricated from β-Ta or β-W, and the second spin Hall structure 508 is fabricated from Pt. The first spin Hall structure 506 includes a first portion 510 and a second portion 512 connected to the first portion 510. The first portion 510 of the first spin Hall structure 506 is adjacent to the second surface 305 of the main pole 220, and the second portion 512 of the first spin Hall structure 506 is adjacent to the fifth surface 310 of the main pole 220, as shown in Figure 5A. In one embodiment, the second portion 512 of the first spin Hall structure 506 is adjacent to the third surface 306 of the main pole 220. The first portion 510 of the first spin Hall structure 506 may be substantially parallel to the second surface 305 of the main pole 220, and the second portion 512 of the first spin Hall structure 506 may be substantially parallel to the fifth surface 310 of the main pole 220. The second spin Hall structure 508 surrounds the first spin Hall structure 506. The second spin Hall structure 508 includes a first portion 514 adjacent to the trailing shield hot seed layer 241 and a second portion 516 connected to the first portion 514. The first portion 514 of the second spin Hall structure 508 may be substantially parallel to the first portion 510 of the first spin Hall structure 506, and the second portion 516 of the second spin Hall structure 508 may be substantially parallel to the second portion 512 of the first spin Hall structure 506.

The spin-torque layer 502 is disposed between the first portion 510 of the first spin Hall structure 506 and the first portion 514 of the second spin Hall structure 508. The spin-torque layer 502 is in direct contact with the first portion 510 of the first spin Hall structure 506 and the first portion 514 of the second spin Hall structure 508, and the opposite surfaces of the spin-torque layer 502 that are in contact with the first spin Hall structure 506 and the second spin Hall structure 508 have same-direction in-plane precessions that are induced by the SOT generated by the first spin Hall structure 506 and the second spin Hall structure 508 as electrical currents flow through the first spin Hall structure 506 and the second spin Hall structure 508. The spin-torque layer 502 may have the same dimensions as the spin-torque layer 250, as shown in FIG. 3A. The spin-torque layer 502 is sandwiched between the dielectric material 254 disposed between the first portion 510 of the first spin Hall structure 506 and the first portion 514 of the second spin Hall structure 508.

The spin-torque layer 504 is disposed between the second portion 512 of the first spin Hall structure 506 and the second portion 516 of the second spin Hall structure 508. The spin-torque layer 504 is in direct contact with the second portion 512 of the first spin Hall structure 506 and the second portion 516 of the second spin Hall structure 508, and the opposite surfaces of the spin-torque layer 504 that are in contact with the first spin Hall structure 506 and the second spin Hall structure 508 have same-direction in-plane precessions that are induced by the SOT generated by the first spin Hall structure 506 and the second spin Hall structure 508 as electrical currents flow through the first spin Hall structure 506 and the second spin Hall structure 508. The spin-torque layer 504 is sandwiched between the dielectric material 254 disposed between the second portion 512 of the first spin Hall structure 506 and the second portion 516 of the second spin Hall structure 508.

Figure 5B:
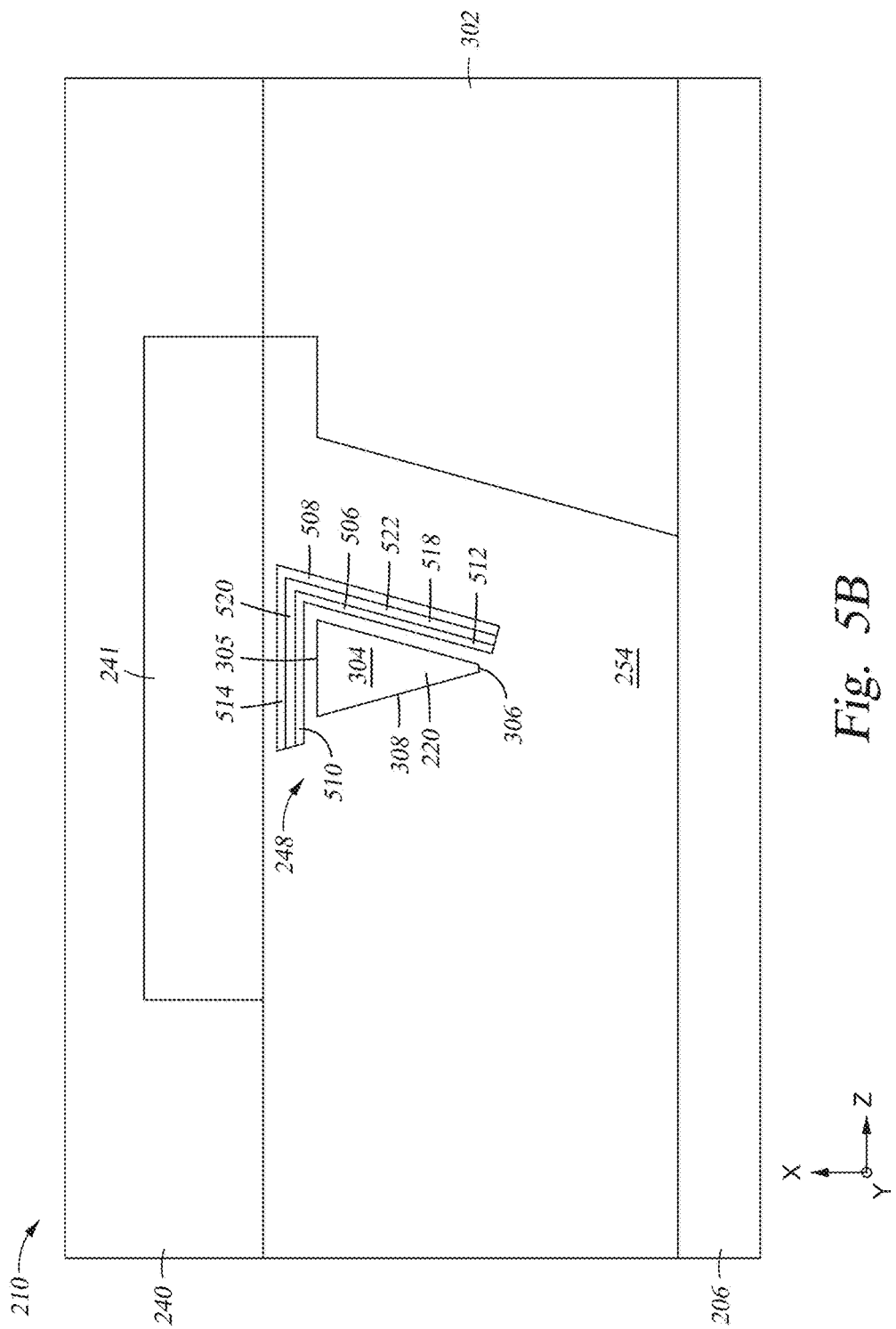

In some embodiments, the spin-torque layers 502, 504 forms a structure that is disposed between the first spin Hall structure 506 and the second spin Hall structure 508. FIG. 5B is a MFS view of the portion of a write head 210 of FIG. 2 according to another embodiment. As shown in FIG. 5B, the oscillator 248 includes the first spin Hall structure 506, the second spin Hall structure 508, and a spin-torque structure 518 sandwiched between the first spin Hall structure 506 and the second spin Hall structure 508. The spin-torque structure 518 may be fabricated from the same material as the spin-torque layer 250. The spin-torque structure 518 includes a first portion 520 and a second portion 522 connected to the first portion 520. The first portion 520 of the spin-torque structure 518 is disposed between the first portion 510 of the first spin Hall structure 506 and the first portion 514 of the second spin Hall structure 508, and the first portion 520 of the spin-torque structure 518 is in direct contact with the first portion 510 of the first spin Hall structure 506 and the first portion 514 of the second spin Hall structure 508. The second portion 522 of the spin-torque structure 518 is disposed between the second portion 512 of the first spin Hall structure 506 and the second portion 516 of the second spin Hall structure 508, and the second portion 522 of the spin-torque structure 518 is in direct contact with the second portion 512 of the first spin Hall structure 506 and the second portion 516 of the second spin Hall structure 508.

During operation, opposite surfaces of the spin-torque structure 518 that are in contact with the first spin Hall structure 506 and the second spin Hall structure 508 have same-direction in-plane precessions that are induced by the SOT generated by the first spin Hall structure 506 and the second spin Hall structure 508 as electrical currents flow through the first spin Hall structure 506 and the second spin Hall structure 508. The same-direction in-plane precessions on opposite surfaces of the spin-torque structure 518 reduce the critical current of the oscillation by the oscillator 248, leading to higher quality recording.

Figure 5C:
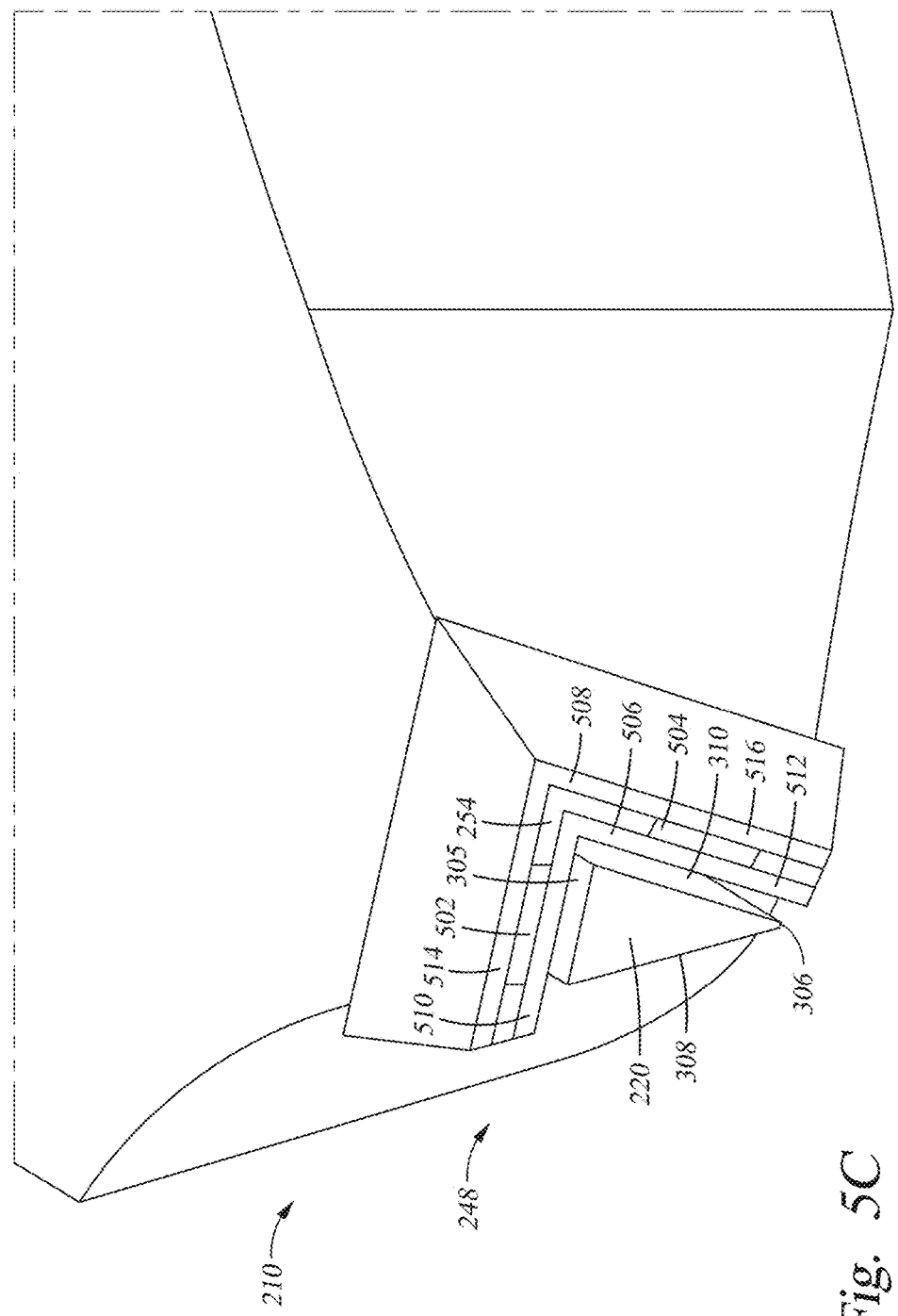
FIG. 5C is a perspective view of the portion of the write head of FIG. 5A according to one embodiment.

FIG. 5C is a perspective view of the portion of the write head 210 of FIG. 5A according to one embodiment. For clarity purposes, the insulating material is not shown in FIG. 5C. The trailing shield 240, the trailing shield hot seed layer 241, the side shields 302, and the leading shield 206 are omitted for clarity. As shown in FIG. 5C, the oscillator 248 includes the first spin Hall structure 506 surrounding two surfaces 305, 310 of the main pole 220, the second spin Hall structure 508 surrounding the first spin Hall structure 506, and two spin-torque layers 502, 504 disposed between the first spin Hall structure 506 and the second spin Hall structure 508. The dielectric material 254 is disposed between the first spin Hall structure 506 and the second spin Hall structure 508, and each of the two spin-torque layers 502, 504 is sandwiched between the dielectric material 254. The two spin-torque layers 502, 504 are discrete layers, as shown in FIGS. 5A and 5C. The two spin-torque layers 502, 504 may be connected, such as the spin-torque structure 518, as shown in FIG. 5B.

The benefits of having a SOT based head is that the spin polarization ratio of the SOT based head is about 2 to 6 times larger than that of a head using a pseudo spin-valve structure, reducing the critical switching current density by 2 to 6 times. As a result of the reduced critical switching current density, the SOT based head has a higher energy efficiency, such as about 2 to 6 times less energy used than that of a head using a pseudo spin-valve structure. Furthermore, the oscillator of the SOT based head includes a spin-torque layer sandwiched between two distinct spin Hall layers. The two distinct spin Hall layers generate SOT that induces in-plane precessions on opposite surfaces of the spin-torque layer, and both in-plane precessions are in the same direction. The same-direction in-plane precessions on opposite surfaces of the spin-torque layer reduce the critical current of the oscillation of the oscillator, leading to high quality recording.

While the foregoing is directed to embodiments of the present disclosure, other and further embodiments of the disclosure may be devised without departing from the basic scope thereof, and the scope thereof is determined by the claims that follow.

The invention claimed is:

1. A magnetic recording head, comprising:
   a main pole; and
   an oscillator surrounding at least two surfaces of the main pole, wherein the oscillator comprises:
      a first spin Hall structure disposed adjacent the main pole;
      a second spin Hall structure surrounding the first spin Hall structure; and
      two or more spin-torque layers disposed between the first spin Hall structure and the second spin Hall structure.

2. The magnetic recording head of claim 1, wherein the first spin Hall structure is distinct from the second spin Hall structure.

3. The magnetic recording head of claim 2, wherein the first spin Hall structure comprises platinum.

4. The magnetic recording head of claim 3, wherein the second spin Hall structure comprises a material selected from the group consisting of beta phase tantalum and beta phase tungsten.

5. The magnetic recording head of claim 1, wherein the main pole comprises a first surface at a media facing surface, a second surface adjacent the first surface, a third surface opposite the second surface, a fourth surface connecting the second surface and the third surface, and a fifth surface opposite the fourth surface.

6. The magnetic recording head of claim 5, wherein the first spin Hall structure surrounds the second surface and one of the fourth and fifth surfaces of the main pole.

7. The magnetic recording head of claim 6, wherein the two or more spin-torque layers comprise two spin-torque layers.

8. A data storage device, comprising:
   a magnetic read head; and
   a magnetic write head, comprising:
      a trailing shield hot seed layer;
      a leading shield;
      a first side shield;
      a second side shield;
      a main pole; and
      an oscillator disposed between the trailing shield hot seed layer and the main pole, between the leading shield and the main pole, between the first side shield and the main pole, and between the second side shield and the main pole.

9. The data storage device of claim 8, wherein the oscillator comprises a first spin Hall structure wrapping around the main pole, and a second spin Hall structure wrapping around the first spin Hall structure.

10. The data storage device of claim 9, wherein the oscillator further comprises a plurality of spin-torque layers disposed between the first spin Hall structure and the second spin Hall structure.

11. The data storage device of claim 9, wherein the oscillator further comprises a spin-torque structure disposed between the first spin Hall structure and the second spin Hall structure.

12. The data storage device of claim 9, wherein the first spin Hall structure is distinct from the second spin Hall structure.

13. The data storage device of claim 12, wherein the first spin Hall structure comprises platinum.

14. The data storage device of claim 13, wherein the second spin Hall structure comprises a material selected from the group consisting of beta phase tantalum and beta phase tungsten.

\* \* \* \* \*